United States Patent
Park et al.

(10) Patent No.: US 7,668,264 B2
(45) Date of Patent: Feb. 23, 2010

(54) APPARATUS AND METHOD OF DECISION FEEDBACK EQUALIZATION IN TERRESTRIAL DIGITAL BROADCASTING RECEIVER

(75) Inventors: Sung-Ik Park, Daejon (KR); Seung-Won Kim, Daejon (KR); Hyoung-Nam Kim, Busan (KR)

(73) Assignee: Electronics and Telecommunications Research Institute, Daejon (KR)

( * ) Notice: Subject to any disclaimer, the term of this patent is extended or adjusted under 35 U.S.C. 154(b) by 607 days.

(21) Appl. No.: 10/579,793

(22) PCT Filed: Mar. 27, 2004

(86) PCT No.: PCT/KR2004/000707
§ 371 (c)(1), (2), (4) Date: May 18, 2006

(87) PCT Pub. No.: WO2005/050987
PCT Pub. Date: Jun. 2, 2005

(65) Prior Publication Data
US 2007/0104264 A1  May 10, 2007

(30) Foreign Application Priority Data
Nov. 20, 2003 (KR) ............... 10-2003-0082725

(51) Int. Cl.
*H03D 1/04* (2006.01)
(52) U.S. Cl. .............. 375/346; 375/233; 375/265; 375/341; 375/343
(58) Field of Classification Search ............. 375/233, 375/265, 341, 343
See application file for complete search history.

(56) References Cited

U.S. PATENT DOCUMENTS

| | | | | |
|---|---|---|---|---|
| 5,303,263 A | * | 4/1994 | Shoji et al. | 375/229 |
| 6,980,609 B1 | * | 12/2005 | Ahn | 375/343 |
| 2004/0213341 A1 | * | 10/2004 | Fimoff et al. | 375/233 |
| 2005/0129107 A1 | * | 6/2005 | Park et al. | 375/233 |

FOREIGN PATENT DOCUMENTS

| | | |
|---|---|---|
| EP | 1058406 | 12/2000 |
| KR | 2002-0096988 | 12/2002 |
| WO | WO 96/02100 | 1/1996 |

OTHER PUBLICATIONS

Hyoung-Nam Kim et al.; "Performance improvement of channel equalization in terrestrial DTV receivers using channel estimation"; 2003 Proceeding of the 2003 Korean Signal Processing Conference; Sep. 27, 2003.
International Search Report dated Aug. 25, 2004 for PCT/KR2004/000707.
"A VSB DTV Receiver Designed for Indoor and Distributed Transmission Enrivonment", R. Citta et al., Proceedings of the IEEE 52nd Annual Broadcast Symposium, 2002.

* cited by examiner

*Primary Examiner*—Chieh M Fan
*Assistant Examiner*—Rahel Guarino
(74) *Attorney, Agent, or Firm*—Lowe Hauptman Ham & Berner, LLP

(57) ABSTRACT

A decision feedback equalizing apparatus and a method of decision feedback equalization make a channel property of an inferior receiving signal to mild by using a channel-matched filter and decrease decision errors of symbol detector output signals by using a trellis decoder with decreased complexity, whose trace back depth is 1 (TBD=1).

12 Claims, 6 Drawing Sheets

TRANSMITTING SIGNAL = (1.0, 1.0, 1.0, -3.0, -5.0)
EQUALIZER INPUT SIGNAL = (1.7, -0.4, 2.5, -1.8, -5,2)
CONVENTIONAL SYMBOL DETECTOR OUTPUT SIGNAL = (1.0, -1.0, 3.0, -1.0, -5.0)
SYMBOL DETECTOR OUTPUT SIGNAL OF PRESENT INVENTION = (1.0, 1.0, 1.0, -3.0, -5.0)

410
| $D_0 \rightarrow$ 8.7 or 0.7 | 6.6 or 1.4 | 9.5 or 1.5 | 5.2 or 2.8 | 1.8 or 6.2 |
| $D_1 \rightarrow$ 6.7 or 1.3 | 4.6 or 3.4 | 7.5 or 0.5 | 3.2 or 4.8 | 0.2 or 8.2 |
| $D_2 \rightarrow$ 4.7 or 3.3 | 2.6 or 5.4 | 5.5 or 2.5 | 1.2 or 6.8 | 2.2 or 10.2 |
| $D_3 \rightarrow$ 2.7 or 5.3 | 0.6 or 7.4 | 3.5 or 4.5 | 0.8 or 8.8 | 4.2 or 12.2 |

420
| $D_0 \rightarrow$ | 0.7 | 1.4 | 1.5 | 2.8 | 1.8 |
| $D_1 \rightarrow$ | 1.3 | 3.4 | 0.5 | 3.2 | 0.2 |
| $D_2 \rightarrow$ | 3.3 | 2.6 | 2.5 | 1.2 | 2.2 |
| $D_3 \rightarrow$ | 2.7 | 0.6 | 3.5 | 0.8 | 4.2 |

…

APPARATUS AND METHOD OF DECISION FEEDBACK EQUALIZATION IN TERRESTRIAL DIGITAL BROADCASTING RECEIVER

CROSS REFERENCE TO RELATED APPLICATION

This application is the National Phase application of International Application No. PCT/KR2004/000707, filed Mar. 27, 2004, which designates the United States and was published in English. This application, in its entirety, is incorporated herein by reference.

TECHNICAL FIELD

The present invention relates to a channel equalization technology in a terrestrial digital apparatus and a method of decision feedback equalization that make a channel property of an inferior receiving signal to be mild by using a channel-matched filter and decreases decision errors of symbol detector output signals by using a trellis decoder with decreased complexity, whose trace back depth is 1 (TBD=1), and a symbol detection method using the same.

BACKGROUND ART

In a general digital broadcasting system, because data are transmitted through a limited frequency bandwidth, a time dispersion effect, which means that pulse energy of a predetermined symbol is dispersed to neighboring symbols, generates interference to the neighboring symbols. Furthermore, the transmitted data is affected from various channel distortions.

As channel distortion, there are such as a multipath, a frequency offset and a phase jitter. The channel distortion occurs an Inter-symbol Interference (ISI), which means interference or a distortion between a predetermined symbol and its neighboring symbols and generates a problem to receive desired data in the digital transmission system.

To prevent the channel distortion and decrease a symbol error due to an ISI, the general receiver, e.g., a digital broadcasting receiver, uses a channel equalizer.

Most of the communication channels need an adaptive equalizer for updating a tap coefficient according to time because the distortions in the general digital broadcasting system are time variant.

Configuration of a conventional channel equalizer is described in FIG. 1.

As shown in FIG. 1, the conventional channel equalizer includes a digital filter 11, a symbol detector 12, a tap coefficient updating unit 13, a training sequence storage 14, a statistical data calculator 15, a switch 16 and an equalizer input signal storage 17.

The digital filter 11 eliminates an inter symbol-interference (ISI) causing a distortion of a baseband signal received to a digital broadcasting receiver. The symbol detector 12 receives the output signal of the digital filter 11 and calculates a decided data by comparing the output signal to a predetermined threshold to thereby output the decided data.

The tap coefficient updating unit 13 receives output signals of the equalizer input signal storage 17 and the digital filter 11 and an error data selected by the switch 16 to thereby update a tap coefficient of the digital filter 11.

Also, the training sequence storage 14 stores the training data sequence already known in a transmitter of a digital broadcasting system. The training data sequence is read in a training mode and is outputted to the tap coefficient update unit 13.

The statistical data calculator 15 calculates a statistical error in order to output the statistical error to the tap coefficient update unit 13 in a blind mode.

The switch 16 selects one of the training storage 14, the statistical data calculator 15 and the symbol detector 12 according to an operating mode and outputs error data outputted from the selected one to the tap coefficient update unit 13. Then, the tap coefficient update unit 13 calculates an error signal corresponding to the error data and updates the tap coefficient by using data corresponding to the tap coefficient of the digital filter 11 in the equalizer input signal storage 17 to output the tap coefficient to the digital filter 11.

As the channel equalizer, the decision feedback equalizer (DFE) is used broadly in the digital broadcasting receiver. In general, the an eye diagram of an output signal in the decision feedback equalizer is opened, wherein the eye diagram is a kind of factor for determining performance of the equalizer, i.e., a function of making an output signal decision rightly and easily. Also, if an output signal of the symbol detector is determined correctly, the feedback filtering block deletes an Inter Symbol Interference (ISI) according to the predetermined symbol and there is not a problem such as a noise amplifying phenomenon in channel equalization of the a linear equalizer. Therefore, the decision feedback equalizer is widely used in the digital broadcasting receiver.

Therefore, for an appropriate use, it is important that the output signal of a symbol detector should not have a decision error and, for the most of all, the eye diagram is opened.

For the eye diagram is opened in Advanced Television System Committee (ATSC) digital broadcasting system which is American standard for a terrestrial digital television, it is used a method for opening the eye diagram by inserting one training sequence segment, wherein one segment is 208 bytes, in every 312 data segment although a data efficiency is decreased.

However, since the inserted training sequence segment is short under a multipath environment having a long ghost, it is often failed to open the eye pattern. In particular, though there is the training sequence, it is often failed if a tap coefficient is not enough long to converge or if the environment is under an inferior multipath environment having a time-varied channel, a long ghost or a large level signal ghost. If the eye diagram is not opened, possibility of the decision error in the symbol detector is very high. As a result, it can be generated an error propagation problem that the decision error is accumulated through a feedback loop of the decision feedback equalizer.

Therefore, it is required a method for decreasing the decision error during data period having no training sequence segment; and, in particular, total tap energy should be decreased in order to decrease the decision error by opening the eye diagram of the decision feedback equalizer.

At first, most of conventional methods for decreasing the decision error use a viterbi decoder having a decoding delay. There is a method for making a predetermined delay in an equalizer tap coefficient adjustor be identical to the decoding delay of the viterbi decoder. Herein, this method is proposed by G. Long, entitled "The LMS Algorithm with Delayed Coefficient Adaptation", IEEE Trans. Acoust., Speeach, Signal Processing, vol. ASSP-37, October 1989.

In addition, there is a method for solving a decoding delay of the viterbi decoder by periodically adding an interleaver and deinterleaver, proposed by M. V. Eyuboglu, entitled "Detection of Coded Modulation Signals on Linear, Severely Distorted Channels Using Decision-Feedback Noise Prediction with Interleaving", IEEE Trans. Commun., vol. COM-36, pp. 401-409, April 1988 and in U.S. Pat. No. 4,833,693 issued to Eyuboglu, May 23, 1989.

Because above described methods for decreasing the decision error are used in the viterbi decoder having the decoding delay as TDB-1 behind the equalizer served as the symbol detector of the decision feedback equalizer, it is required that additional devices for deleting the decoding delay. Also, for the viterbi decoder behind the equalizer has enough performance, the TBD should be 5 times more than the number of memories in the trellis encoder used for encoding process. However, the decoding delay should be as small as possible in order to use the output of the viterbi decoder as a feedback input of the decision feedback equalizer.

Particularly, the decoding delay is not TBD-1 but 12× (TBD-1) in the digital broadcasting system which uses 12 TCM encoders by the trellis code interleaver as shown in FIG. 5; and, approximately, the decoding delay becomes 168 because there are 2 memories in the TCM encoder. It is very inefficient that the viterbi decoder having 168 decoding delay is actually used in the digital broadcasting system.

Therefore, for using the viterbi decoder as the symbol detector of the decision feedback equalizer in the digital broadcasting receiver, the decoding delay is as small as possible and, further, it is the best that there is no decoding delay. And a complexity for decoder implementation should be as low as possible.

Meanwhile, in order to decrease the tap energy of the feedback filter, there are methods for increasing the tap number which removes post ghost and for changing channel property of a receiving signal by using a beam-forming or a channel-matched filter.

The method for increasing the tap number of the feed forward filter is inefficient and the improvement of the performance is small in comparison to the increased tap number. The method for changing the channel property by using the channel-matched filter, which is proposed in a document by Richard Citta, entitled "A VSB Receiver Designed for Indoor and Distributed Transmission Environments", IEEE 52nd Annual Broadcast Symposium, Oct. 9-11, 2002, is more effective than the method for increasing the tap number.

Because the channel equalization method proposed by Richard Citta generates the channel-matched filter based on over-sampling data and uses a fractionally-spaced equalizer, the complexity is very high. Also, since a simple slicer is used as the symbol detector, the error propagation problem due to the decision error can occur.

Therefore, development for a channel-matched filter having low complexity on a symbol basis and a symbol detector having rare decision error are highly required.

Disclosure

Technical Problem

It is, therefore, an object of the present invention to provide an apparatus and a method of decision feedback equalization that make a channel property of an inferior receiving signal to mild by using a channel-matched filter and decreases decision errors of symbol detector output signals by using a trellis decoder with decreased complexity, whose trace back depth is 1 (TBD=1).

The other object of the present invention provide a symbol detection method of the trellis decoder with decreased complexity, of which TDB is 1, which can use an output signal of trellis decoder as an input signal of the feedback filter of the decision feedback equalizer by decreasing a decoding delay.

Technical Solution

In accordance with one aspect of the present invention, there is provided a decision feedback equalizer in a terrestrial digital broadcasting receiver, including: a channel estimating unit for estimating a channel of a symbol-based receiving signal based on the receiving signal and a training sequence; a channel-matched filtering unit for changing a channel property of the receiving signal by maximizing a signal-to-noise ratio (SNR) of the estimated channel; an input signal storing unit for storing a receiving symbol of which channel property is changed by the channel-matched filtering unit; a channel equalizing unit for performing a decision feedback equalization by repeatedly filtering the receiving signal which passed through the channel-matched filtering unit; a trellis decoding unit for detecting a symbol, which is decision data, based on trellis decoding algorithm with decreased complexity, whose trace back depth is 1, from channel equalized receiving symbols and outputting the symbol in a decision directed mode; a statistical data calculating unit for calculating statistical error data used in a blind mode and outputting the statistical error data; a training sequence storing unit for storing the training sequence; a switching unit for selecting a mode among the training mode, the decision directed mode and the blind mode; an error signal calculating unit for calculating an error signal by comparing an output signal in the mode selected by the switching unit to an output signal of the channel equalizing unit; and a tap coefficient updating unit for updating a tap coefficient to be provided to the channel-matched equalizing unit based on the error signal, the output signal of the trellis decoding unit and the output signal of the input signal storing unit.

In accordance with one aspect of the present invention, there is provided a decision feedback equalizing method in a terrestrial digital broadcasting receiver, including the steps of: a) estimating a channel of a symbol-based receiving signal based on a receiving signal and a training sequence; b) changing a channel property of the receiving signal in order to maximize a signal-to-noise ratio (SNR) of the estimated channel by passing the receiving signal through a channel-matched filter; c) determining a parameter used for a decision feedback of the receiving symbol whose channel property is changed and initializing a channel equalization parameter; d) detecting a symbol from an output signal of an equalizer in a specific time index signal according to the determined parameter based on a trellis decoder with decreased complexity, whose trace back depth is 1; e) calculating statistical error data used in a blind mode; f) selecting one mode among a training mode, a decision mode and the blind mode; g) calculating an error signal by comparing an output signal of the mode selected in the step f) to output signal of equalizer in a decision directed mode, and updating a tap coefficient based on the error signal; and h) performing a decision feedback equalization based on the updated tap coefficient.

In accordance with one aspect of the present invention, there is provided a symbol detecting method for channel equalization in a terrestrial digital broadcasting receiver, the method including the steps of: a) calculating an absolute distance pairs between symbol pairs in an input signal of a symbol detector and a trellis diagram; b) selecting an absolute distance having a small value for each absolute distance pair among absolute distance pairs; c) calculating an accumulated absolute distance by adding a previous absolute distance to a current calculated absolute distance for each state in the trellis diagram in a time index; d) deleting the accumulated absolute distances except the smallest accumulated absolute distance for each state in the trellis diagram in the time index; e) selecting a state in which the accumulated absolute distance is smallest among all states shown in the trellis diagram in the time index and obtaining an output signal of the symbol detector, which is the trellis decoding unit, from a branch shown in the trellis diagram transited to the selected state; and f) repeatedly performing the steps a) to e) for each symbol time index.

The present invention relates to an apparatus and a method for decision feedback equalization having a channel-matched filter and a trellis decoder in a terrestrial digital broadcasting receiver, wherein the channel estimator estimates the channel of the receiving signal based on the receiving signal and the training sequence, generates the channel-matched filter based on information of the estimated channel, equalizes the receiving signal passed though the channel-matched filter by using the decision feedback equalizer having the viterbi decoder with decreased complexity, whose TBD is 1, and thereby the channel equalization is performed effectively under an inferior environment such as in a room or in mobile The present invention can change the channel property of the receiving signal under an inferior environment such as in a room or in mobile to be mild by placing the channel-matched filter generated from the symbol-based channel estimator in front of the conventional decision feedback equalizer, and decreases the decision error of the symbol detector by using the viterbi decoder with decreased complexity, whose TBD is 1, in stead of the simple slicer served as the symbol detector in the conventional decision feedback equalizer and thereby a convergence speed and stability of the digital filtering block are increased, and the residual MSE is decreased in a normal state after the convergence.

Advantageous Effect

As mentioned above, the present invention can change the channel property of the receiving signal under an inferior environment such as in a room or in mobile to be mild by placing the channel-matched filter generated from the symbol-based channel estimator in front of the conventional decision feedback equalizer, and decreases the decision error of the symbol detector the viterbi decoder with decreased complexity, whose TBD is 1, in stead of the simple slicer served as the symbol detector in the conventional decision feedback equalizer and thereby a convergence speed and stability of the digital filtering block are increased, and the residual MSE is decreased in a normal state after the convergence.

BRIEF DESCRIPTION OF DRAWINGS

The above and other objects and features of the present invention will become apparent from the following description of the preferred embodiments given in conjunction with the accompanying drawings, in which.

BEST MODE FOR THE INVENTION

The above and other objects and features of the present invention will become apparent from the following description in conjunction with the accompanying drawings. Hereinafter, preferred embodiments of the present invention will be described in detail with reference to the drawings.

Figure 1:
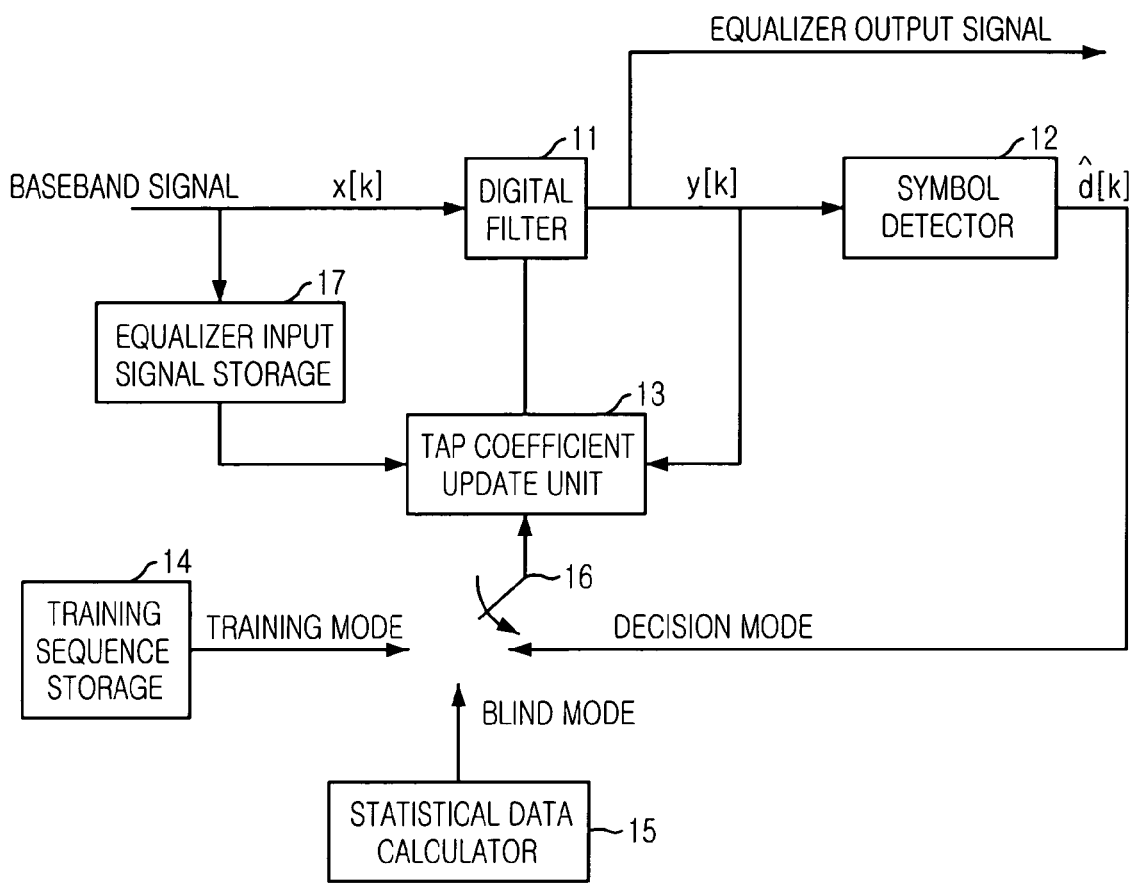
FIG. 1 is a conventional block diagram illustrating a decision feedback equalizer.
Figure 2:
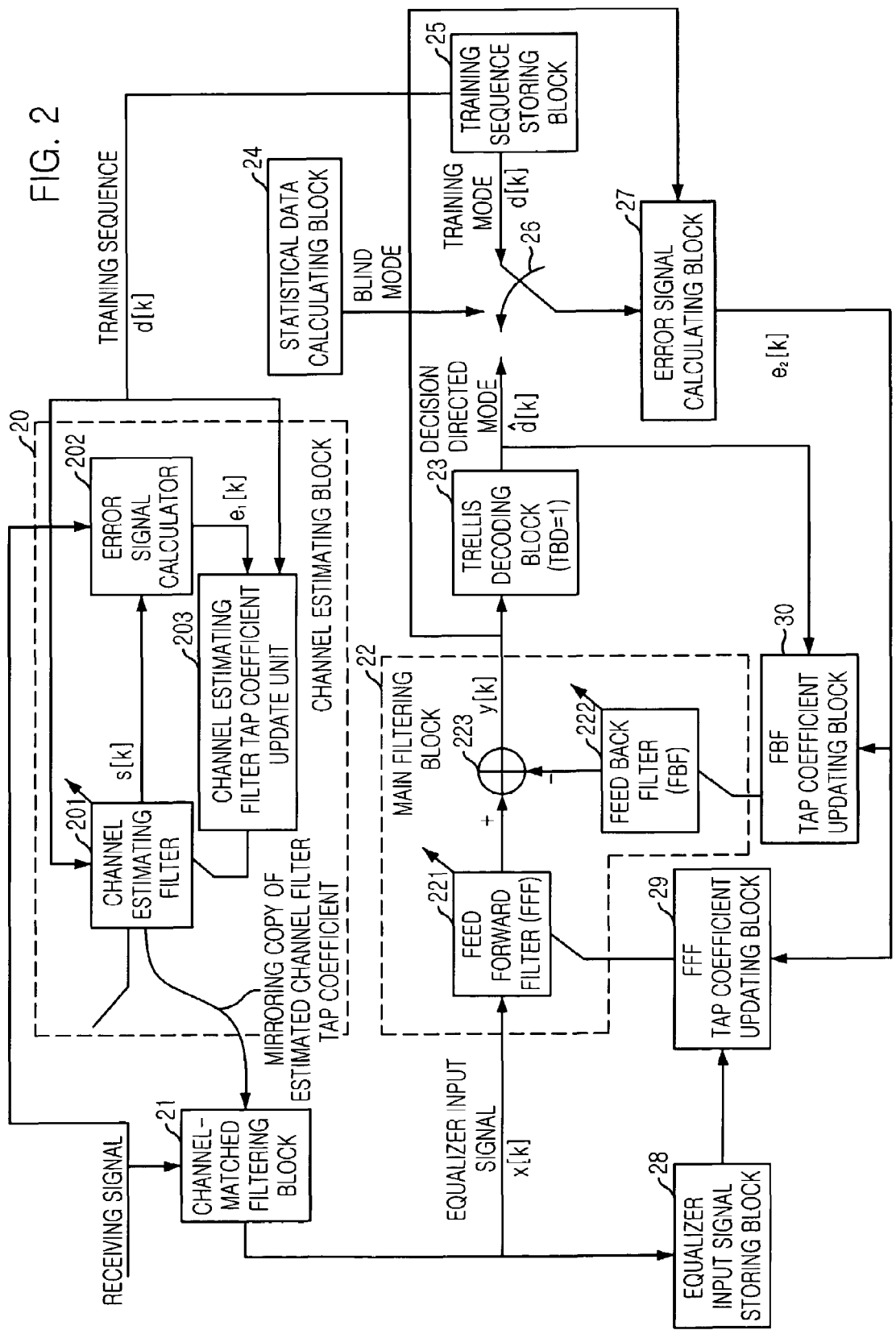
FIG. 2 is a block diagram illustrating a decision feedback equalizer in accordance with an embodiment of the present invention.

FIG. 2 is a block diagram illustrating a decision feedback equalizer in accordance with an embodiment of the present invention.

For understanding the present invention, before configuration and operation of a decision feedback equalizer having a channel-matched filtering block 21 and a trellis decoding block 23 are described, a process of equation calculation for the tap coefficient update in a channel estimating block 20 and a main filtering block 22 will be described as follows.

First of all, input signals of the channel estimating block 20 and the main filtering block 22, a reference signal and a tap coefficient are defined as follows.

$h_C$ is a tap coefficient of a channel estimating filter 201 of the channel estimating block 20.

r[k] is a desired signal needed for updating the tap coefficient of the channel estimating filter 201 in time k and is an input signal of a channel-matched filtering block 21.

s[k] is an output signal of the channel estimating filter 201 in time k.

$h_M$ is a tap coefficient of the channel-matched filtering block 21.

x[k] is an input signal of the main filtering block 22 in time k or an output signal of the channel-matched filtering block 21.

y[k] is an output signal of the main filtering block 22 in time k.

$b_i[k]$ is a tap coefficient of a feed forward filter (FFF) 221 in the main filtering block 22 in time k.

$a_i[k]$ is a tap coefficient of a fed back filter (FBF) 222 in the main filtering block 22 in time k.

The tap coefficient $h_C$ of the channel estimating filter 201 is expressed as:

$$h_C = \sum_{i=0}^{N-1} h_{C,i} \cdot \delta[i] \qquad \text{(Eq. 1)}$$

Wherein, N is a tap number of the channel estimating filer 201, $h_{C,i}$ is an ith tap coefficient of the channel estimating filter 201, $\delta[i]$ is an unit sample function. The output signal of the channel estimating filter 201 based on $h_C$ is expressed as:

$$s[k] = \sum_{i=0}^{N-1} h_{C,i} \cdot d[k-i] \qquad \text{(Eq. 2)}$$

Wherein, d[k] is a training sequence stored in a training sequence storing block 25.

An error signal $e_1[k]$ for the tap coefficient update of the channel estimating filter 201 is expressed as:

$$e_1[k]=r[k]-s[k] \qquad \text{(Eq. 3)}$$

Wherein, a channel estimating filter tap coefficient updating unit 203 updates the tap coefficient of the channel estimating filter 201 based on the error signal $e_1[k]$.

The tap coefficient of the channel-matched filtering block 21 obtained based on the updated tap coefficient of the channel estimating filter 201 is expressed as:

$$h_M = \sum_{i=0}^{N-1} h^*_{C,N-i} \cdot \delta[i] \quad \text{(Eq. 4)}$$

Wherein, * denotes a complex conjugate. $h_M$ is obtained by calculating a symmetrical pair of $h_C$. According to the above mentioned process, the channel-matched filtering block 21 is also called as a channel mirror filter.

An equalizer input signal obtained based on the channel-matched filtering block 21 is expressed as:

$$x[k] = \sum_{i=0}^{N-1} h_{M,i} \cdot r[k-i] \quad \text{(Eq. 5)}$$

Wherein, N is a tap number of the channel-matched filter 21 and has identical tap number and a tap length with them of the channel estimating filter and $h_{M,i}$ is a tap coefficient of the ith channel-matched filter 21.

An equation of the output signal y[k] of the main filter 22 obtained based on the equalizer input signal x[k] is expressed as:

$$y[k] = \sum_{i=0}^{N_b-1} b_i[k]x[k-i] - \sum_{j=0}^{N_a} a_j[k]\hat{d}[k-j] \quad \text{(Eq. 6)}$$

Wherein, $N_b$ is a tap number of the FFF 221, $N_a$ is a tap number of the FBF 222, d̂[k] is an output signal decided by comparing the output signal y[k] of the main filter 22 to the threshold determined by the simple slicer, i.e., the symbol detector 11 in advance. Herein, the error signal $e_2$[k] for tap coefficient update is expressed as:

$$e_{21}[k] = \hat{d}[k] - y[k] \quad \text{(Eq. 7)}$$

If the error signal for the tap coefficient update is expressed as Eq. 7, equations for the tap coefficient update of the FFF 221 and the FBF 222 are expressed as:

$$b_i[k+1] = b_i[k] + \mu e[k]x[k-i]$$

$$a_j[k+1] = a_j[k] - \mu e[k]\hat{d}[k-j] \quad \text{(Eq. 8)}$$

Wherein, μ is a step size, which is a value determining a convergence speed and a Mean Square Error (MSE) of a normal state.

That is, if the μ is large, the convergence speed is getting faster and the residual MSE of the normal state is getting larger. However, if the μ is small, the residual MSE is getting smaller but the convergence speed is getting slower.

As mentioned above, because an eye diagram of the output signal of the decision feedback equalizer is opened generally, if the output signal d̂[k] of the symbol detector 12, i.e., the simple slicer, is a symbol decided correctly, the feedback filtering block deletes the ISI due to the pre-decided symbol and noise amplifying phenomenon in an output signal of a filtering block does not occur in a linear equalizer during equalization. For the above mentioned characteristic, the decision feedback equalizer is widely used.

However, if the symbol decided by the symbol detector 12, i.e., the simple slicer, has an error, because the error is accumulated and propagated while passing through the feedback filtering block, safety is not guaranteed.

Therefore, the eye diagram is opened by inserting periodically the training sequence determined between a transmitter and a receiver in advance, and then if the training sequence period is over and the data period is started, the output signal d̂[k] of the symbol detector 12, i.e., the simple slicer, is used because a transmitting symbol is unknown.

As mentioned above, it is called as decision directed equalization that the output signal of the symbol detector 12, i.e., the simple slicer, is used for updating the tap coefficient.

The present invention changes the channel property of the receiving signal received in an inferior environment such as in room and in mobile to be mild by placing the channel-matched filtering block 21 generated from the channel estimating block 20 on a symbol basis in front of the conventional decision feedback equalizer, and decreases the decision error of the symbol detector 12 by using the viterbi decoder with decreased complexity, whose TBD is 1, instead of the simple slicer used in the symbol detector 12 and thereby convergence speed of the digital filtering block can be increased, and the residual MSE can be decreased in the normal state after the convergence.

The decision feedback equalizer having the channel-matched filtering block and the trellis decoding block, whose TBD is 1 and having the decreased complexity, in accordance with the present invention can be applied to the 8-VSB which is a standard of American terrestrial digital television and thereby the decision error in the output signal of the symbol detector is decreased and the equalization performance can be increased.

The 8-VSB system uses one of the 313 segments as the training sequence, wherein the transmitting symbol is a 8 level-signal of ±1, ±3, ±5, ±7, which has 1-dimensional characteristic in different with a quadrature amplitude modulation (QAM) scheme.

Hereinafter, the configuration and the operation of the decision feedback equalizer having the channel-matched filtering block 21 and the trellis decoding block 23 in the terrestrial digital broadcasting receiver in accordance with the present invention are described in detail.

As shown in FIG. 2, the decision feedback equalizer having the channel-matched filtering block 21 and the trellis decoding block 23 in the terrestrial digital broadcasting receiver in accordance with the present invention includes the channel estimating block 20 for estimating a channel of a receiving signal on a symbol basis based on the receiving signal and the training sequence, the channel-matched filtering block 21 for changing a channel property of the receiving signal by maximizing a signal-to-noise ratio (SNR) of the channel estimated by the channel estimating block 20, an equalizer input signal storing block 28 for storing the symbol having the channel property changed by the channel-matched filtering block 21, the main filtering block 22 for performing the decision feedback equalization, i.e., the channel equalization, by filtering the signal passing the channel-matched filtering block 21 repeatedly, a trellis decoding block 23 for detecting the symbol, i.e., decision data, from the receiving symbol performed the channel equalization based on a trellis decoding algorithm whose Trace Back Depth (TDB) is 1, and outputting the detected symbol in the decision directed mode, the statistical data calculating block 24 for calculating and outputting the statistical error data needed in a blind mode, the training sequence storing block 25 for storing the training sequence, the switch 26 for selecting one of the output signal of a training mode, the decision directed mode and the blind mode, the error signal calculating block 27 for calculating the error signal by comparing the output signal of the mode selected by the switch 26, which can be the decision data, the statistical error data or the training sequence, to the output signal, which is decision feedback equalized data, of the main filtering block 222, the FFF tap coefficient updating block 29 for updating the tap coefficient to be provided to the FFF 221 of the main filtering block 22 based on the error signal of the error signal calculating block 27 and the output signal of the equalizer input signal storing block 28, and the FBF tap coefficient updating block 30 for updating the tap coefficient to be provided to the FBF 22 based on the error signal of the error signal calculating block 27 and the output signal of the trellis decoding block 23.

However, the channel estimating block 20 includes the channel estimating filter 201, the error signal calculator 202, and the channel estimating tap coefficient updating unit 203.

The main filtering block 22 includes the equalization FFF 221 and the equalization FBF 222 and an equalizer output calculator 223.

Operations of each element of the decision feedback equalizer having the channel-matched filtering block 21 and the trellis decoding block 23 in accordance with the present invention will be described as follows.

The channel estimating block 20 estimates the channel based on the receiving signal r[k] and the training sequence d[k] during the training sequence period. Herein, the error signal calculator 202 calculates the error signal $e_1[k]$ based on the receiving signal r[k] and the output signal s[k] of the channel estimating filter 201, and the channel estimating filter tap coefficient updating unit 203 updates the tap coefficient $h_C$ to be provided to the channel estimating filter 201 based on the calculated error signal $e_1[k]$. The channel estimating block 20 estimates a channel of the receiving signal on a symbol basis based on the training sequence and the receiving signal for each L field (1 training sequence segment is inserted for every 312 data segments, wherein 1 field has 313 segments and L is larger than 1) or for a first field, generates the channel-matched filtering block 21 in order to maximize the SNR of the estimated channel and changes the generated channel property of the receiving signal by passing the receiving signal through the channel-matched filtering block 21, and thereby the channel property of the receiving signal can be mild.

The channel-matched filtering block 21 generates the channel-matched filter tap coefficient $h_M$ based on the channel estimating filter tap coefficient $h_C$ calculated by the channel estimating block 20, and maximizes the SNR of the receiving signal r[k] based on the generated channel-matched filter tap coefficient $h_M$ and the receiving signal r[k].

The main filtering block 22 performs the channel equalization by filtering the output signal of the channel-matched filtering block 21 repeatedly.

Figure 5:
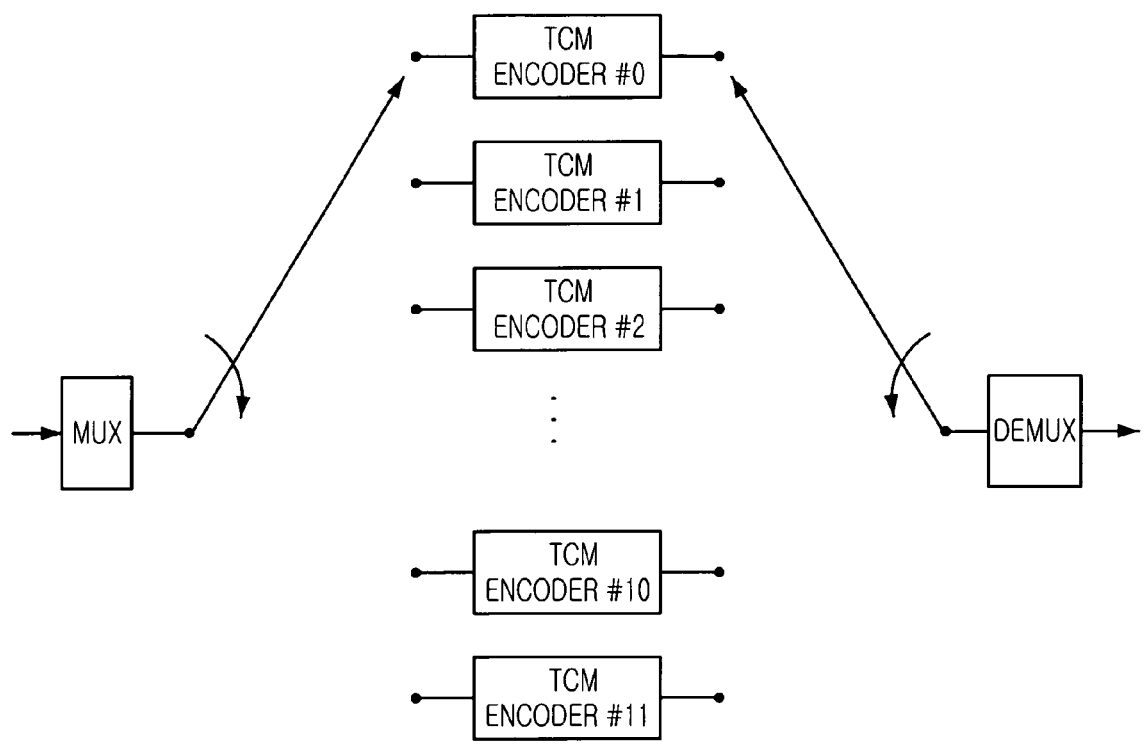
FIG. 5 is a block diagram illustrating a trellis coded interleaver used in an ATSC 8-VSB transmission system.

The trellis decoding block 23 detects a symbol from the signal transmitted from the main filtering block 22 based on the viterbi decoding algorithm whose TBD is 1. The trellis decoding block 23 detects the symbol based on the viterbi decoding algorithm with decreased complexity, whose TBD is 1, in the digital broadcasting system in which 12 TCM encoders is used by the trellis code interleaver as shown in FIG. 5, and thereby the decoding delay can be 0.

The statistical data calculating block 24 calculates the statistical data needed in the blind mode.

The training sequence storing block 25 stores the training sequence used by the channel estimating block 20 in the training mode.

The switch 26 selects one of the output signal of the training mode, the decision directed mode and the blind mode.

The error signal calculating block 27 calculates the error signal $e_2[k]$ by comparing the output signal y[k] of the main filtering block 22 to the output signal d̂[k] of the trellis decoding block 23 or the output signal of the statistical data calculating block 24.

The FFF tap coefficient updating unit 29 updates the tap coefficient $b_i[k]$ to be provided to the FFF 221 based on the output signal of the equalizer input signal storing block 28 and the error signal $e_2[k]$ calculated by the error signal calculating block 27.

The FBF tap coefficient updating block 30 updates the tap coefficient $a_i[k]$ to be provided to the FBF 222 based on the output signal d̂[k] of the trellis decoding block 23 and the error signal of the error signal $e_2[k]$ calculated by the calculating block 27.

Operation of the trellis decoding block 23 detecting a symbol based on the viterbi decoding algorithm with decreased complexity, whose TBD is 1, will be described in conjunction with FIGS. 3 and 4 as follows.

Figure 3:
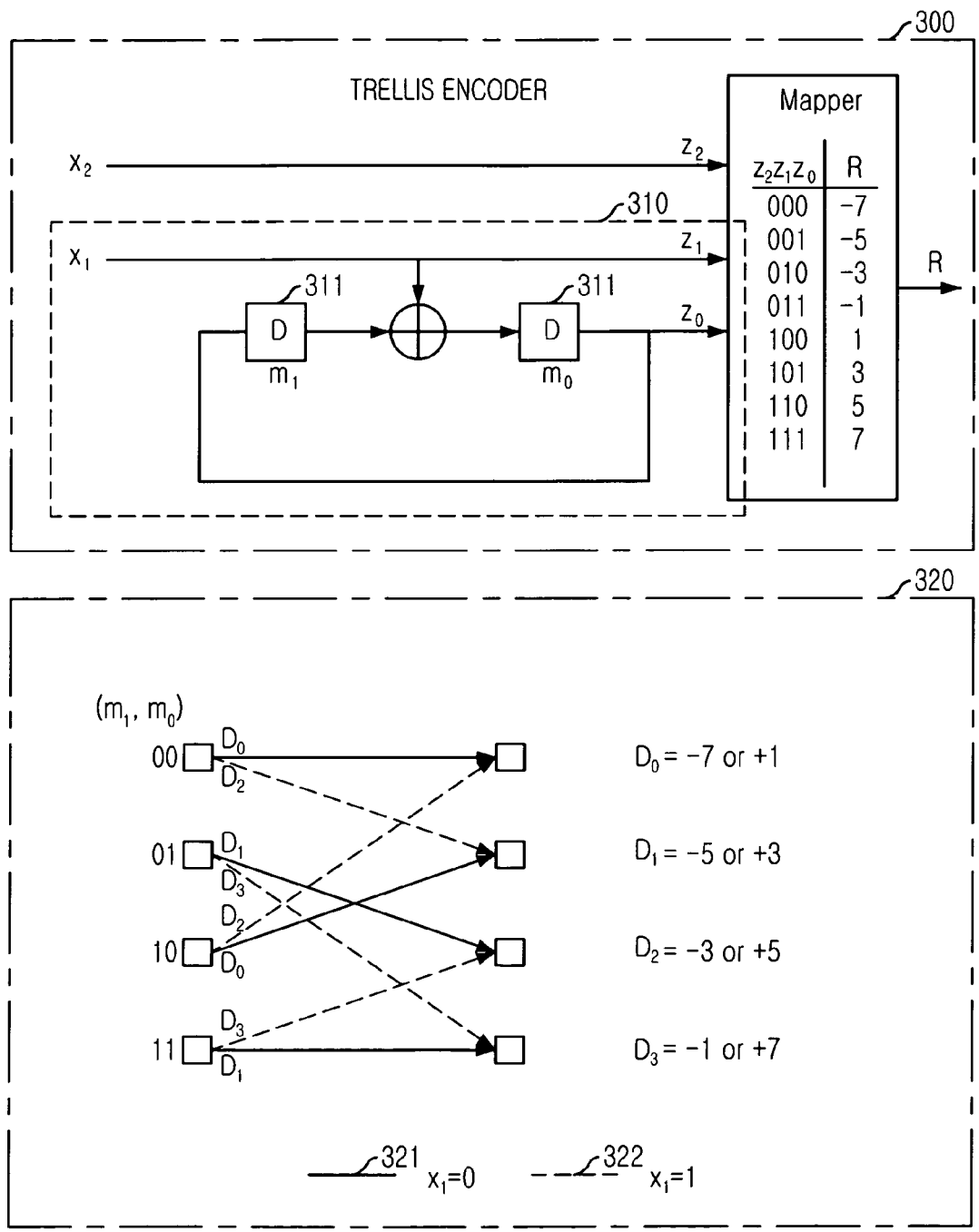
FIG. 3 is a block diagram illustrating a Trellis-coded modulation (TCM) encoder used in an Advanced Television System Committee (ATSC) 8-vestigial sideband (8-VSB) transmission system and a trellis diagram thereof.

FIG. 3 is a block diagram illustrating a trellis encoder, which is a Trellis-coded modulation (TCM) encoder 300, used in an Advanced Television System Committee (ATSC) 8-vestigial sideband (8-VSB) transmission system and a trellis diagram 320 thereof.

In a trellis diagram 320 of FIG. 3, a solid line 321 denotes a state transition of a memory 311 when an input signal $x_1$ of a convolution encoder is 0 and a dotted line 322 denotes the state transition of the memory 311 when the input signal $x_1$ of the convolution encoder 310 is 1.

3-bits output signal ($z_0$, $z_1$, $z_2$) is obtained after 2-bits is inputted at the coding rate 2/3 trellis encoder, which is composed of 2 delay units and 1 binary calculator in a baseband, and 8 kind of information expressed by the 3-bits is mapped to symbols of $\{-7, -5, -3, -1, 1, 3, 5, 7\}$. An output signal of a symbol mapper is passed through a VSB modulator and a frequency spectrum to be transmitted is obtained.

According to the coding rate 2/3 trellis encoder 300, i.e., the TCM encoder of the transmitting system, the transmitting symbol is increased from 2-bits to 3-bits such that the output symbol is presented 8 constellations. Therefore, distance between neighboring symbol constellations becomes 2 such that a noise margin is decreased. However, the symbol error correction is performed by the trellis decoder, i.e., the TCM encoder of the transmitter such that the distance between output constellations is transformed from hamming distance to an euclidean distance and then, an effective distance is increased. Therefore, performance is better than a case of that the TCM encoder is not applied in a view of Threshold Of Visibility (TOV).

It is assumed that an initial state of the TCM encoder 311, i.e., delay unit, of FIG. 3 is "0($m_1$=0,$m_0$=0)", and an output signal, i.e., transmitting signal, is 1.0, 1.0, 1.0, −3.0 and −5.0. Also, it is assumed that the output signal of the equalizer main filtering block 22, which is the input signal of the symbol detector, i.e., the trellis decoding block 23 is 1.7, −0.4, 2.5, −1.8 and −5.2. Then, an output signal of the simple slicer used as the symbol detector 12 in the conventional decision feedback equalizer in the digital broadcasting receiver becomes 1.0, −1.0, 3.0, −1.0 and −5.0 such that an error occurs in three symbols −1.0, 3.0 and −1.0.

However, if the symbol is detected based on the trellis decoding algorithm, i.e., the viterbi decoding algorithm with decreased complexity, whose TBD is 1, an error of the trellis decoding block 23, i.e., the symbol detector, can be decreased remarkably.

Figure 4:
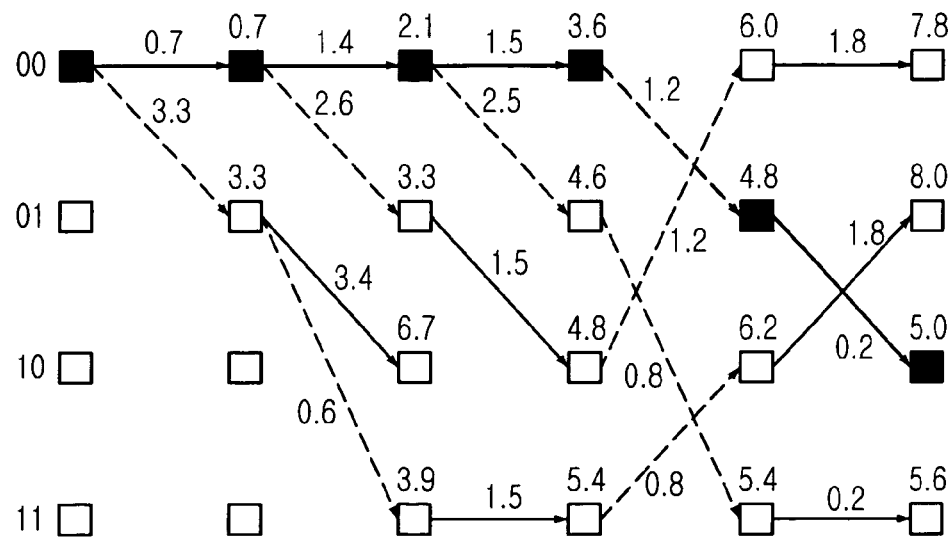
FIG. 4 is a diagram illustrating a symbol detection process of a trellis decoder (TBD=1 and having increased complexity) included in a decision feedback equalizer of the present invention.

FIG. 4 is a diagram illustrating a symbol detection process of a trellis decoder of the decision feedback equalizer in accordance with an embodiment the present invention, which is the symbol detecting process based on the viterbi decoding algorithm as an example of the trellis decoding.

As shown, in different with the conventional viterbi decoder, the viterbi decoder 23 with decreased complexity, whose TBD is 1, calculates absolute distance 410 between the input signal y[k] of the symbol detector and 4 symbol pairs [$D_0$(=−7 or +1), $D_1$(=−5 or +3), $D_2$(=−3 or +5), $D_3$(=−1 or +7)] shown in the trellis diagram 320 based on Eq. 9 expressed as:

$$\text{Absolute distance} = |y[k] - D_i|, i=0,1,2,3 \quad \text{(Eq. 9)}$$

Then, smaller absolute distance 420 is selected for each of calculated absolute distance pairs 410.

Then, new accumulated absolute distance is calculated by adding the accumulated absolute distance and the absolute distance currently in every state [0=(00), 1=(01), 2=(20), 3=(11)] shown in the trellis diagram 320 in time k.

In time k, all accumulated absolute distance except the smallest accumulated absolute distance are deleted for every state shown in the trellis diagram 320.

The state having the smallest accumulated absolute distance among all states shown in the trellis diagram 320 in time k is selected and an output signal is obtained from a branch of the trellis diagram, which is transited to the selected state.

Finally, the above processes are performed repeatedly in a symbol time index k.

According to the processes, the output signal of trellis decoding block 23 detecting a symbol based on the viterbi algorithm with decreased complexity, whose TBD is 1, becomes 1.0, 1.0, 1.0, −3.0 and −5.0 and is identical to the output signal of the trellis encoder, i.e., the TCM encoder in a digital broadcasting transmitting system, in FIG. 3.

As mentioned above, the decision feedback equalizer having the trellis decoding block 23 with decreased complexity, whose TBD is 1, decreases the decision error in the output signal of the symbol detector such that the convergence speed can be increased and the residual MSE can be decreased after the convergence.

Figure 6:
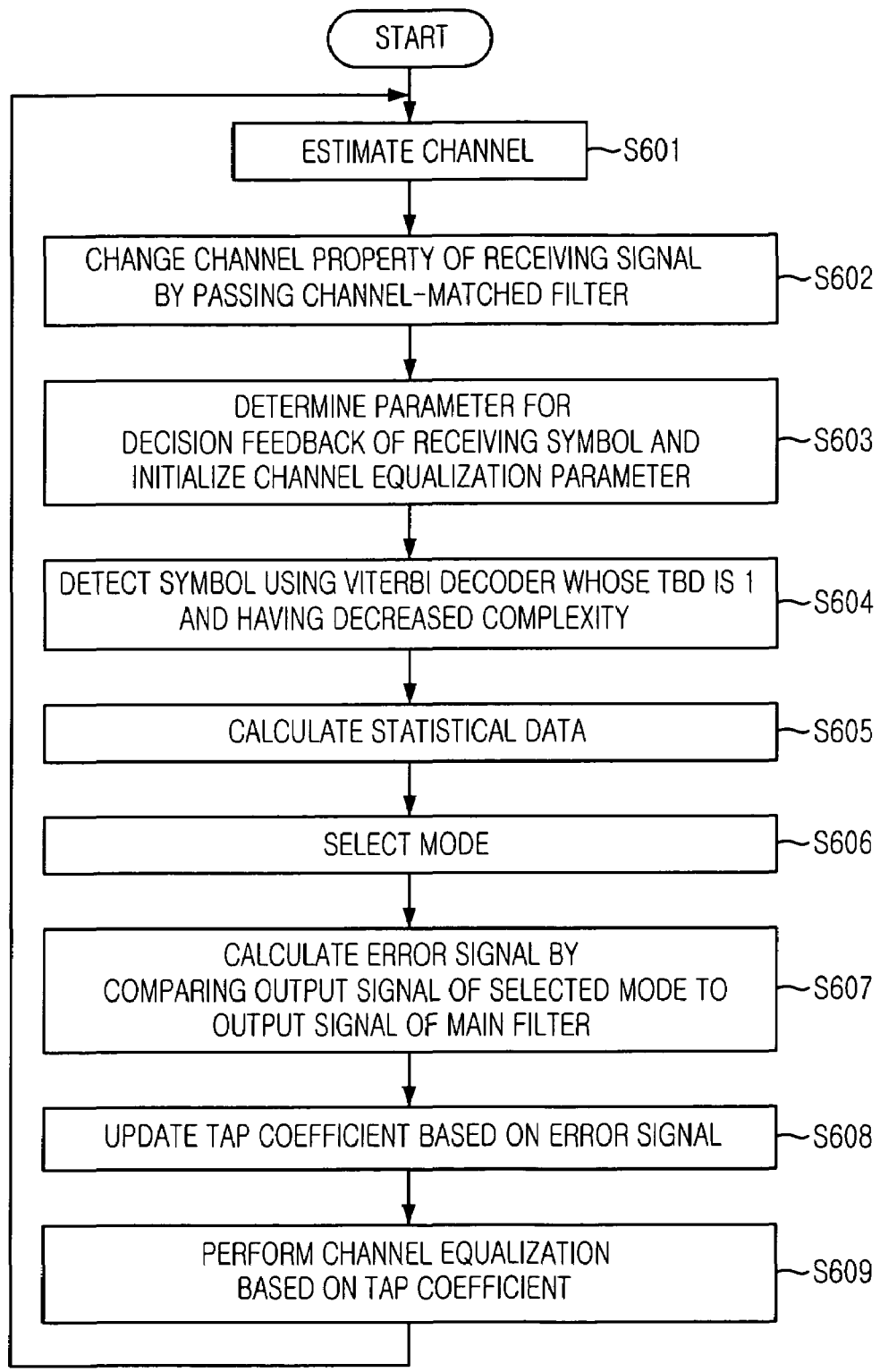
FIG. 6 is a flow chart describing a method of decision feedback equalization in accordance with an embodiment of the present invention.

FIG. 6 is a flow chart describing a method of decision feedback equalization in accordance with an embodiment of the present invention.

At first, a channel estimating block 20 estimates a channel based on a receiving signal r[k] and a training sequence d[k] during a training sequence interval at step S601.

Then, the channel estimating block 20 changes the channel property of the receiving signal r[k] by passing through the channel-matched filtering block 21 in order to maximize the SNR of the estimated channel at step S602. Therefore, the channel property of a receiving signal in an inferior environment such as in a room and in mobile can be change to be mild.

At step S603, a parameter for effective decision feedback of the receiving symbol is determined and a channel equalization parameter is initialized.

Symbols are detected from an equalizer output signal of a specific time index signal based on the determined parameter using viterbi decoder with decreased complexity, whose TBD is 1, at step S604.

The statistical data calculating block 24 calculates statistical data for the blind mode at step S605.

One mode is selected by using a switching block 26 among the training mode, the blind mode and the decision mode at step S606.

The error signal calculating block 27 calculates an error signal $e_2$[k] by comparing an output signal of the selected mode, e.g., if the training mode is selected, an output signal d̂[k] of the trellis decoder 23, else if the blind mode is selected, an output signal of the statistical data calculating block 24, to an output signal y[k] of the main filtering block 22 at step S607.

The error signal $e_2$[k] is transmitted to the feed forward filter (FFF) tap coefficient updating block 28 and the feed back filter (FBF) updating block 29 and is used for updating the FBF tap coefficient $a_i$[k] and the FFF tap coefficient $b_i$[k] at step S608. In other words, the FFF tap coefficient updating block 28 updates the FFF tap coefficient $b_i$[k] based on the output signal of the equalizer input signal storing block 27 and the error signal $e_2$[k], and the FBF tap coefficient updating block 28 updates the FFF tap coefficient $a_i$[k] based on the output signal d̂[k] of the trellis decoder 23 and the error signal $e_2$[k].

The main filtering block 22 performs channel equalization based on the updated FFF/FBF tap coefficients $b_i$[k] and $a_i$[k] at step S609.

The steps S601 to S609 are performed repeatedly.

The method of the present invention can be embodied as a program and stored in a computer-readable recording medium, such as CD-ROM, RAM, ROM, floppy disks, hard disks, magneto-optical disks and the like. Since the process can be easily implemented by those of ordinary skill in the art, further description on it will not be provided herein.

While the present invention has been described with respect to certain preferred embodiments, it will be apparent to those skilled in the art that various changes and modifications may be made without departing from the scope of the invention as defined in the following claims.

What is claimed is:

1. A decision feedback equalizer in a terrestrial digital broadcasting receiver, comprising:
    a channel estimating unit for estimating a channel of a symbol-based receiving signal based on the receiving signal and a training sequence;
    a channel-matched filtering unit for changing a channel property of the receiving signal by maximizing a signal-to-noise ratio (SNR) of the estimated channel;
    an input signal storing unit for storing a receiving symbol of which channel property is changed by the channel-matched filtering unit;
    a channel equalizing unit for performing a decision feedback equalization by-repeatedly filtering the receiving signal which passed through the channel-matched filtering unit;
    a trellis decoding unit for detecting a symbol, which is decision data, based on trellis decoding algorithm with decreased complexity, whose trace back depth is 1, from channel equalized receiving symbols, and outputting the symbol in a decision directed mode;
    a statistical data calculating unit for calculating statistical error data used in a blind mode and outputting the statistical error data;
    a training sequence storing unit for storing the training sequence;
    a switching unit for selecting a mode among a training mode, the decision directed mode and the blind mode;
    an error signal calculating unit coupled downstream of the switching unit for calculating an error signal by comparing an output signal in the mode selected by the switching unit to an output signal of the channel equalizing unit; and
    a tap coefficient updating unit comprising
        a first input coupled to an output of the error signal calculating unit,
        a second input coupled to an output of the trellis decoding unit, a third input coupled to an output of the input signal storing unit, and an output coupled to the channel equalizing unit for updating a tap coefficient based on the error signal received from the error signal calculating unit, the output signal of the trellis decoding unit, and the output signal of the input signal storing unit, and for providing the updated tap coefficient to the channel equalizing unit.

2. The decision feedback equalizer as recited in claim 1, wherein the tap coefficient updating unit includes:

a feed forward filter (FFF) tap coefficient updating unit for updating a tap coefficient to be provided to a FFF of the channel equalizing unit based on the output signal of the input signal storing unit and the error signal;

and a feed back filter (FBF) tap coefficient updating unit for updating a tap coefficient to be provided to a FBF of the channel equalizing unit based on the error signal and the output signal of the trellis decoding unit.

3. The decision feedback equalizer as recited in claim 1, wherein the channel estimating unit estimates the channel of the symbol-based receiving signal based on the training sequence and the receiving signal for each L field or for a first field, wherein 1 field includes 313 segments and L is larger than 1, generates the channel-matched filtering unit in order to maximize the SNR of the estimated channel and passes the receiving signal through the channel-matched filtering unit, and thereby the channel property of the receiving signal becomes mild.

4. The decision feedback equalizer as recited in claim 1, wherein the trellis decoding unit detects a symbol based on a modified viterbi algorithm whose TBD is 1 and having the decreased complexity in American Advanced Television Systems Committee (ATSC) 8-vestigial sideband (8-VSB) transmission system using twelve trellis encoders, which are TCM decoders, based on a trellis code interleaver and thereby a decoding delay becomes 0.

5. A decision feedback equalizer in a terrestrial digital broadcasting receiver, comprising:

a channel estimating unit for estimating a channel of a symbol-based receiving signal based on the receiving signal and a training sequence;

a channel-matched filtering unit for changing a channel property of the receiving signal by maximizing a signal-to-noise ratio (SNR) of the estimated channel;

an input signal storing unit for storing a receiving symbol of which channel property is changed by the channel-matched filtering unit;

a channel equalizing unit for performing a decision feedback equalization by-repeatedly filtering the receiving signal which passed though the channel-matched filtering unit;

a trellis decoding unit for detecting a symbol, which is decision data, based on trellis decoding algorithm with decreased complexity, whose trace back depth is 1, from channel equalized receiving symbols, and outputting the symbol in a decision directed mode;

a statistical data calculating unit for calculating statistical error data used in a blind mode and outputting the statistical error data;

a training sequence storing unit for storing the training sequence;

a switching unit for selecting a mode among a training mode, the decision directed mode and the blind mode;

an error signal calculating unit for calculating an error signal by comparing an output signal in the mode selected by the switching unit to an output signal of the channel equalizing unit; and a tap coefficient updating unit for updating a tap coefficient to be provided to the channel equalizing unit based on the error signal, the output signal of the trellis decoding unit and the output signal of the input signal storing unit;

the trellis decoding unit comprises a symbol detector configured to perform a symbol detecting process of:

a) calculating an absolute distance pair including two absolute distances between symbol pairs in an input signal of the symbol detector and a trellis diagram;

b) selecting an absolute distance having a small value for each absolute distance pair among absolute distance pairs;

c) calculating an accumulated absolute distance by adding a previous absolute distance to a current calculated absolute distance for each state in the trellis diagram in a time index;

d) deleting the accumulated absolute distances except the smallest accumulated distance for each state in the trellis diagram in the time index;

e) selecting a state in which the accumulated absolute distance is smallest among all states shown in the trellis diagram in the time index and obtaining an output signal of the symbol detector from a branch shown in the trellis diagram transited to the selected state; and f) repeatedly performing the steps a) to e) for each symbol time index.

6. A decision feedback equalizing method in a terrestrial digital broadcasting receiver, said method comprising the steps of:

a) estimating a channel of a symbol-based receiving signal based on a receiving signal and a training sequence;

b) changing a channel property of the receiving signal in order to maximize a signal-to-noise ratio (SNR) of the estimated channel by passing the receiving signal through a channel-matched filter;

c) determining a parameter used for a decision feedback of the receiving symbol whose channel property is changed, and initializing a channel equalization parameter;

d) detecting a symbol from an output signal of an equalizer in a specific time index signal according to the determined parameter based on a trellis decoder which has a trace back depth (TBD) of 1 and decreased complexity;

e) calculating statistical error data used in a blind mode;

f) selecting one mode among a training mode, a decision mode and the blind mode;

g) calculating an error signal by comparing an output signal of the mode selected in the step f) to the output signal of the equalizer, and updating a tap coefficient of a filtering block of the equalizer based on the error signal, the output signal of the equalizer and the receiving signal passed through the channel-matched filter; and h) performing a decision feedback equalization in which the filtering block of the equalizer filters the receiving signal passed through the channel-matched filter based on the updated tap coefficient of said filtering block.

7. The decision feedback equalizing method as recited in claim 6, wherein a channel estimator estimates the symbol-based receiving signal based on the training sequence and the receiving signal for each L field, or for a first field, wherein 1 field includes 313 segments and L is larger than 1, generates the channel-matched filter in order to maximize the SNR of the estimated channel and passing the receiving signal through the channel-matched filter, and thereby the channel property of the receiving signal becomes mild.

8. The decision feedback equalizing method as recited in claim 6, wherein the trellis decoder detects a symbol based on a modified viterbi algorithm with decreased complexity, whose TBD is 1, in American Advanced Television Systems Committee (ATSC) 8-vestigial sideband (8-VSB) transmission system using twelve trellis encoders, which are Trellis-coded modulation (TCM) decoders, based on a trellis code interleaver and thereby a decoding delay becomes 0.

9. The decision feedback equalizing method as recited in claim 6, wherein a channel estimator estimates the channel of the receiving signal based on the receiving signal and the training sequence, generates the channel-matched filter based on information of the estimated channel, equalizes the receiving signal passed through the channel-matched filter by using the equalizer having the trellis decoder, which is based on the modified viterbi algorithm and has decreased complexity and TBD of 1, and thereby the decision feedback equalization is performed effectively under an inferior environment such as in a room or in mobile.

10. A symbol detecting method for channel equalization in a terrestrial digital broadcasting receiver, the method comprising the steps of:

a) calculating an absolute distance pair including two absolute distances between symbol pairs in an input signal of a symbol detector and a trellis diagram;

b) selecting an absolute distance having a small value for each absolute distance pair among absolute distance pairs;

c) calculating an accumulated absolute distance by adding a previous absolute distance to a current calculated absolute distance for each state in the trellis diagram in a time index;

d) deleting the accumulated absolute distances except the smallest accumulated distance for each state in the trellis diagram in the time index;

e) selecting a state in which the accumulated absolute distance is smallest among all states shown in the trellis diagram in the time index and obtaining an output signal of the symbol detector from a branch shown in the trellis diagram transited to the selected state; and f)

repeatedly performing the steps a) to e) for each symbol time index.

11. A computer-readable medium containing therein computer-executable instructions which, when executed by a computer, cause the computer to perform the method of claim 9.

12. A computer-readable medium containing therein computer-executable instructions which, when executed by a computer, cause the computer to perform the method of claim 10.

* * * * *